(12) United States Patent
Chang

(10) Patent No.: US 9,778,297 B2
(45) Date of Patent: Oct. 3, 2017

(54) POWER DETECTOR AND ASSOCIATED METHOD FOR ELIMINATING THE DIFFERENCE OF I-V PHASE DIFFERENCE BETWEEN TRANSMISSION PATH AND DETECTION PATH

(71) Applicant: MEDIATEK INC., Hsin-Chu (TW)

(72) Inventor: Po-Yu Chang, Changhua County (TW)

(73) Assignee: MEDIATEK INC., Hsin-Chu (TW)

( * ) Notice: Subject to any disclaimer, the term of this patent is extended or adjusted under 35 U.S.C. 154(b) by 301 days.

(21) Appl. No.: 14/745,483

(22) Filed: Jun. 22, 2015

(65) Prior Publication Data

US 2016/0069940 A1 Mar. 10, 2016

Related U.S. Application Data

(60) Provisional application No. 62/045,570, filed on Sep. 4, 2014.

(51) Int. Cl.
| | |
|---|---|
| *G01R 25/00* | (2006.01) |
| *G01R 21/133* | (2006.01) |
| *H03F 3/21* | (2006.01) |
| *H04B 17/13* | (2015.01) |
| *H04B 17/16* | (2015.01) |
| *H04B 17/00* | (2015.01) |
| *H04B 17/10* | (2015.01) |

(Continued)

(52) U.S. Cl.
CPC .............. *G01R 21/133* (2013.01); *H03F 3/21* (2013.01); *H04B 17/13* (2015.01); *H04B 17/16* (2015.01); *H04B 17/0085* (2013.01); *H04B 17/102* (2015.01); *H04B 17/104* (2015.01); *H04B 17/14* (2015.01); *H04B 17/19* (2015.01)

(58) Field of Classification Search
CPC ........ H03H 7/21; H03F 1/30; H03F 2200/294
See application file for complete search history.

(56) References Cited

U.S. PATENT DOCUMENTS

| | | | |
|---|---|---|---|
| 2004/0021516 A1* | 2/2004 | Oishi | ................... H03F 1/3247 |
| | | | 330/149 |
| 2007/0007942 A1 | 1/2007 | King | |

(Continued)

OTHER PUBLICATIONS

I. Župunski et al., Power Factor Calibrator, THP1-2, Jun. 17, 1996, pp. 554-555, XP032373649.

(Continued)

*Primary Examiner* — Giovanni Astacio-Oquendo
*Assistant Examiner* — Alvaro Fortich
(74) *Attorney, Agent, or Firm* — Winston Hsu

(57) ABSTRACT

A power detector for detecting an output power of a power amplifier is provided. The power amplifier is used to transmit signal power to the antenna. The power detector includes a phase shifter, a multiplier and a calibration unit. The phase shifter sequentially applies a plurality of candidate phase calibration amounts to the output voltage of the power amplifier to generate a plurality of adjusted signals with different phases in a calibration mode. The multiplier sequentially mixes the replica current and each of the plurality of adjusted signals, to generate a plurality of analog signals with different phases. The calibration circuit determines a target phase calibration amount of the phase shifter from the candidate phase calibration amounts according to the plurality of analog signals.

14 Claims, 3 Drawing Sheets

(51) Int. Cl.
    *H04B 17/14*    (2015.01)
    *H04B 17/19*    (2015.01)

(56) References Cited

U.S. PATENT DOCUMENTS

2009/0302945 A1* 12/2009 Catoiu ................. H03F 1/3229
                                                            330/252
2011/0187349 A1*  8/2011 Yamamoto ......... G01R 31/2822
                                                            324/119

OTHER PUBLICATIONS

Winoto, A WLAN and Bluetooth Combo Transceiver with Integrated WLAN Power Amplifier, Transmit-Receive Switch and WLAN/Bluetooth Shared Low Noise Amplifier, 2012.

* cited by examiner ent invention relate
POWER DETECTOR AND ASSOCIATED METHOD FOR ELIMINATING THE DIFFERENCE OF I-V PHASE DIFFERENCE BETWEEN TRANSMISSION PATH AND DETECTION PATH

CROSS REFERENCE TO RELATED APPLICATIONS

This application claims the benefit of U.S. provisional application No. 62/045,570, filed on Sep. 4, 2014 and incorporated herein by reference.

BACKGROUND

The disclosed embodiments of the present invention relate to a power detector and associated method for detecting the output power of a power amplifier.

A power detector is utilized for performing a transmission signal strength indication (TSSI) operation in order to perform transmission power compensation. The power detector is required to be less sensitive to transmitter output impedance variation. Please refer to FIG. 1, which is a diagram illustrating a conventional power detector 100 arranged for detecting the output power of the power amplifier 30. The power detector 100 includes a power amplifier replica 40, a multiplier 50 and a detection module 60. The power amplifier 30 amplify input voltage Vi and output amplified current I1, and the power amplifier replica 40 receive the same input voltage $V_i$, and output replica current I2 for detection, respectively, wherein I1=$G_m$*$V_i$, I2=a*$G_m$*Vi, and "a" is replica ratio (a constant parameter) of the power amplifier replica 40. The output voltage V1 equals to Z*I1, wherein Z is the impedance value of the antenna 72. Since the current I2 is the detected replica current, the detected power $P_{det}$ may be obtained by multiplying the detected voltage V1 and the detected current I2.

There exist phase delay between transmission and detection in both voltage and current paths. We can simplify it the equivalent phase delay as "ϕ" exist in voltage detection path only as shown in FIG. 1, and the I-V phase difference caused by non-ideal matching of the antenna 72 is denoted as "θ", wherein if the antenna 72 is an ideal antenna having the nominal 50Ω impedance, the phase difference θ introduced by the antenna 72 is zero.

The accuracy of detecting the power of the power amplifier 30 is affected and limited by both the phase delay ϕ and the phase difference θ. The output power $P_o$ of the power amplifier 30 is represented as $P_o=(G_m^2 V_i^2 |Z| \cos θ)/2$, and the detected power $P_{det}$ is represented as $P_{det}=aG_m^2 V_i^2 |Z| \cos(θ+ϕ)$. The ratio of the detected power $P_{det}$ and the output power $P_o$ is represented as $P_{det}/P_o$=2 a cos (θ+ϕ)/cos θ. Since "a" is a constant, the value of the ratio "cos (θ+ϕ)/cos θ" may be used to indicate the difference between the output power $P_o$ outputted by the power amplifier 30 and the detected power $P_{det}$. If the phase delay ϕ is too large, the output power $P_o$ will not be followed by the detected power $P_{det}$, resulting in the phase difference θ unable to be tracked. Consequently, the detected power $P_{det}$ would be unable to track the variation of the output power $P_o$ which is caused by non-ideal antenna.

Therefore, there is a need to provide a novel power detector capable of compensating the phase difference between the transmission path and the detection path of the power amplifier.

SUMMARY

One of the objectives of the present invention is to provide a power detector which has a phase shifter in the detection path (e.g. the voltage path) and an associated method, which can compensate the I/V phase differences between the transmission path and the detection path to thereby improve the TSSI accuracy.

An embodiment of the present invention provides a power detector. The power detector is used for detecting an output power of a power amplifier. The new power detector includes a phase shifter, a multiplier and a calibration unit. The phase shifter is connected to the output of power amplifier, and applies a plurality of candidate phase calibration amounts to output voltage signal of power amplifier to generate a plurality of adjusted signals with different phases in a calibration mode. The multiplier multiplies the voltage signal from phase shifter and replica current signal of power amplifier and its output is used for power detection. The calibration circuit is coupled to the multiplier, and arranged to determine a target phase calibration amount of the phase shifter from the candidate phase calibration amounts according to the plurality of analog signals.

Another embodiment of the present invention provides a method for phase difference calibration. The method includes: sequentially applying a plurality of candidate phase calibration amounts to output voltage of power amplifier to generate a plurality of adjusted signals with different phases in a calibration mode; sequentially multiplying the replica current and each of the plurality of adjusted signals, to generate a plurality of analog signals with different phases; and determining a target phase calibration amount from the candidate phase calibration amounts according to the plurality of analog signals.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 2:
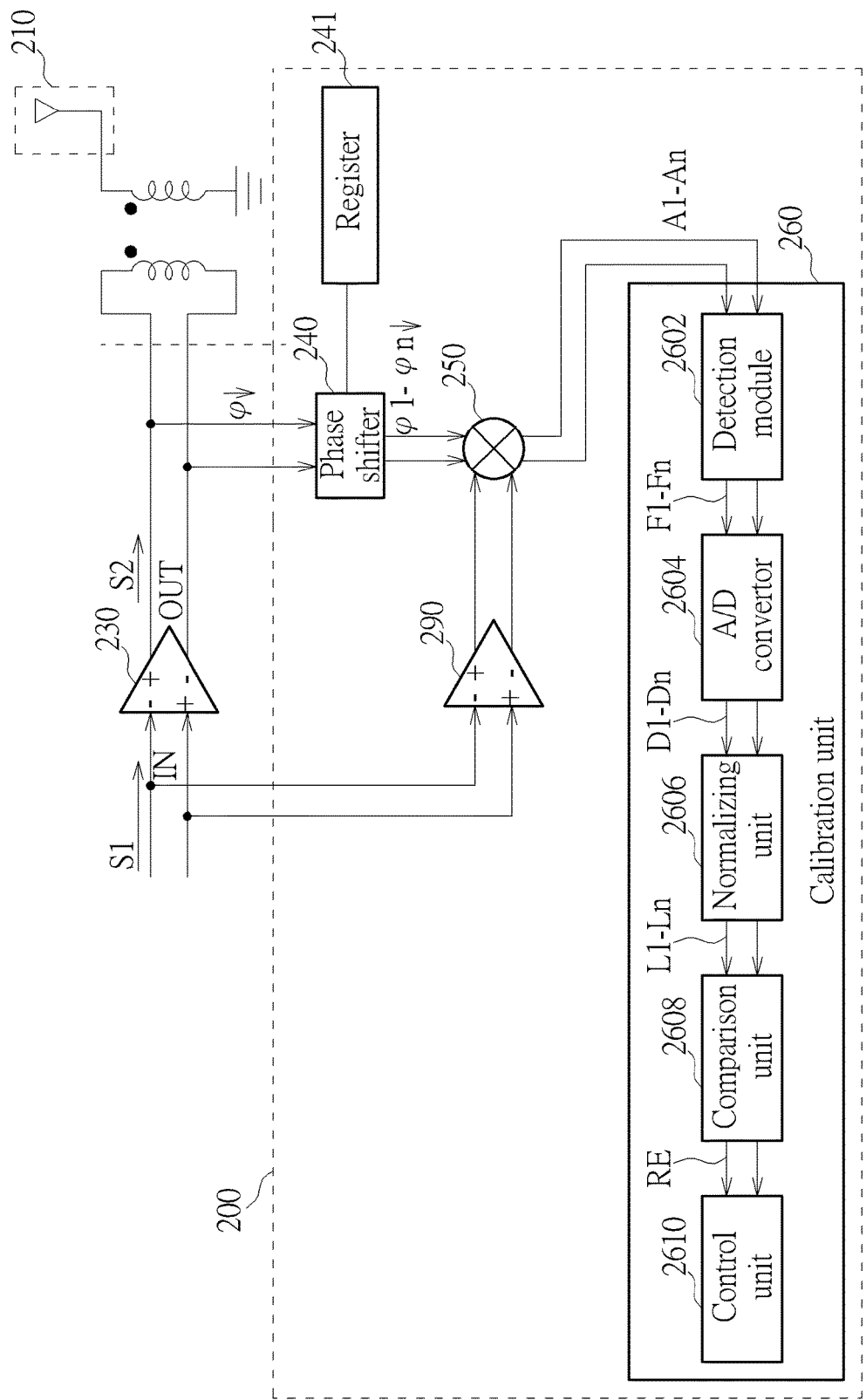
FIG. 2 is a diagram illustrating a power detector according to an embodiment of the present invention.

Please refer to FIG. 2, which is a diagram illustrating a power detector 200 according to an embodiment of the present invention. The power detector 200 is used for detecting the output power of the power amplifier (PA) 230, where the power amplifier 230 has an input end IN and an output end OUT, the input end IN of the power amplifier 230 is used to receive an input signal S1, and the power amplifier 230 generates an amplified signal S2 with the output power at the output end OUT according to the input signal S1. The power detector 200 includes a phase shifter 240, a multiplier 250 and a calibration unit 260. Besides, an antenna module 210 is coupled to the output of power amplifier. Please note that the influence of the antenna module 210 can be eliminated if the antenna module 210 is ideally matched or connected to an adjusting device. For example, during the calibration operation, the antenna module 210 in FIG. 2 may be replaced with an adjusting equipment. In this way, the antenna module 210 may have a 50Ω load, which will make V and I be in-phase on it, so as to eliminate the influence of the phase difference θ. However, when using the power amplifier 230, the power amplifier 230 should be coupled to the antenna module 210 instead of the aforementioned adjusting equipment.

The phase shifter 240 is coupled to the output end OUT of the power amplifier 230, and arranged to receive the amplified signal S2 from the power amplifier 230 and sequentially apply a plurality of candidate phase calibration amounts $\Delta\phi 1$-$\Delta\phi n$ to the amplified signal S2 to generate a plurality of adjusted signals $\phi 1$-$\phi n$ with different phases in a calibration mode. Each of the adjusted signals $\phi 1$-$\phi n$ is a phase generated by adding an adjusting phase to the phase delay $\phi$, e.g. $\phi 1 = \phi + \Delta\phi 1$, where $\phi 1$ is one of the adjusted signals. Please note that the operations upon the power detector 200 may be divided into two modes; the first being the aforementioned calibration mode, and the other being a normal mode which does not perform the calibration operation.

Figure 1:
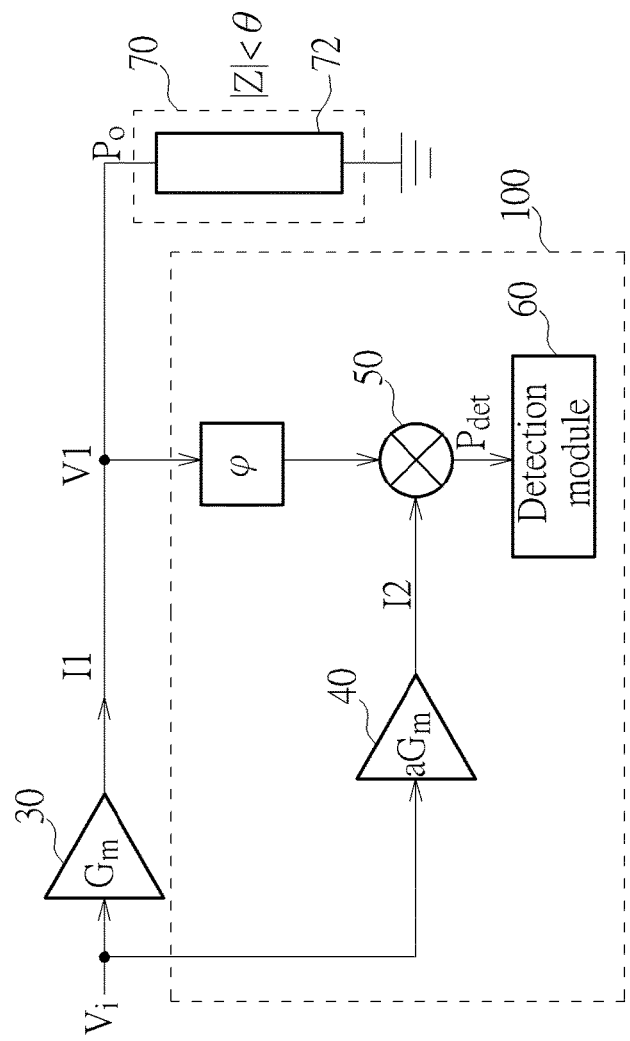
FIG. 1 is a diagram illustrating a conventional power detector arranged for detecting the output power of the power amplifier.

As shown in FIG. 2, the multiplier 250 coupled to the phase shifter 240 and the replica of the power amplifier 290 can be implemented as a mixer, which is used to multiply the adjusted power amplifier output signals with phase $\phi 1$-$\phi n$ with the signals from a power amplifier replica 290. Please note that the power amplifier replica 290 may be configured between the input end IN of the power amplifier 230 and the input end of the multiplier 250. This is merely for illustrative purposes, and not meant to be a limitation of the present invention. In some modifications of this embodiment, the power amplifier replica 290 may be optional. The characteristics and functions of the power amplifier replica 290 can be similar to those of the power amplifier replica 40 shown in FIG. 1, and further descriptions will be omitted here for brevity.

The calibration circuit 260 is coupled to the multiplier 250, and arranged to determine a target phase calibration amount of the phase shifter 240 from the candidate phase calibration amounts $\Delta\phi 1$-$\Delta\phi n$ according to the plurality of analog signals A1-An. For example, in phase calibration mode, once an analog signal having the largest amplitude among the analog signals A1-An is detected by the calibration circuit 260, an optimal candidate phase calibration amount corresponding to this analog signal is determined. The calibration circuit 260 includes a filter 2602, an analog-to-digital (A/D) convertor 2604, a normalizing unit 2606, a comparison unit 2608 and a control unit 2610. The filter 2602 is arranged to perform a filtering operation upon the plurality of analog signals A1-An received from the multiplier 250 to generate a plurality of filtered analog signals F1-Fn. Please note that the filter 2602 may be a low pass filter, but the present invention is not limited thereto. In some modifications of this embodiment, the filter 2602 may be a band pass filter or a high pass filter.

The A/D convertor 2604 is arranged to convert the plurality of filtered analog signals F1-Fn received from the filter 2602 into a plurality of digital values D1-Dn. The A/D convertor 2604 is also optional based on the configurations of following elements.

The normalizing unit 2606 is arranged to normalize the plurality of digital values D1-Dn received from the A/D convertor 2604 to generate a plurality of normalized digital values L1-Ln, respectively. Please note that the normalizing unit 2606 may be omitted based on the types of contents of the digital values D1-Dn. The comparison unit 2608 is arranged to compare the plurality of digital values normalized L1-Ln to generate a comparison result RE. The control unit 2610 is arranged to refer to the comparison result RE to configure the phase shifter 240 to use the target phase calibration amount selected from the plurality of candidate phase calibration amounts $\Delta\phi 1$-$\Delta\phi n$. Please note that the power amplifier 230 may be part of a transmitter, and both the filter 2602 and the A/D converter 2604 may be part of a receiver.

More specifically, when the comparison result RE indicates that a specific normalized digital value among the normalized digital values L1-Ln corresponding to a specific phase calibration amount is a maximum value among the normalized digital values L1-Ln, the control unit 2610 configures the phase shifter 240 to use the specific phase calibration amount as the target phase calibration amount. This target phase calibration amount may be fixed by the phase shifter 240, so that the output power of the power amplifier 230 is correctly detected by the power detector 200.

The power detector 200 may further include a register 241 which is arranged to store a control value corresponding to the target phase calibration amount, wherein the phase shifter 240 is controlled by the control value to provide the target phase calibration amount in the normal mode.

More specifically, the phase shifter 240 may generate a plurality of phases in the range of 0-360 degrees. For example, 12 phases can be generated in the Cartesian coordinates by using a combination of 4 numbers: $\{-3, -1, 1, 3\}$. This combination may determine 16 positions on the Cartesian coordinates, e.g. $\{3, 1\}$, $\{3, -1\}$, $\{3, 3\}$, $\{3, -3\}$, $\{-3, 1\}$, $\{-3, -1\}$, $\{-3, 3\}$, $\{-3, -3\}$, $\{1, 3\}$, $\{1, -3\}$, $\{-1, 3\}$ and $\{-1, -3\}$. The positions $\{1, 1\}$ and $\{3, 3\}$ have the same phase, so the position $\{1, 1\}$ is removed. Similarly, the position $\{1, -1\}$, $\{-1, 1\}$ and $\{-1, -1\}$ are also removed. 12 phases therefore remain.

If the phase shifter 240 generates a phase based on the position $\{3, 3\}$, the magnitude corresponding to this phase is $\sqrt{18}$, and the normalizing unit 2606 in the calibration unit 260 needs to normalize this output signal by dividing it by $\sqrt{18}$. If the phase shifter 240 generates a phase based on the position $\{1, 3\}$, the magnitude corresponding to this phase will be $\sqrt{10}$, and the normalizing unit 2606 in the calibration unit 260 needs to normalize this output signal by dividing it by $\sqrt{10}$. This is merely for illustrative purposes, and not meant to be a limitation of the present invention. In some modifications of this embodiment, the number of phases generated by the phase shifter 240 may be larger or smaller than 12. Moreover, in some modifications of this embodiment, the normalizing unit 2606 may be omitted.

The phase shifter 240 may be controlled by a plurality of phase control commands to generate the aforementioned 12 phases. For example, the phase control commands may be 12 4-bit binary values, such as 4'b0000, 4'b0001, 4'b0010, 4'b0011, 4'b0100, 4'b0111, 4'b1000, 4'b1011, 4'b1100, 4'b1101, 4'b1110, 4'b1111 corresponding to the positions {3, 1}, {3, −1}, {3, 3}, {3, −3}, {−3, 1}, {−3, −1}, {−3, 3}, {−3, −3}, {1, 3}, {1, −3}, {−1, 3} and {−1, −3} in the Cartesian coordinates, respectively. The control unit 2610 may determine the target phase calibration amount selected from the plurality of candidate phase calibration amounts Δϕ1-Δϕn according to the comparison result RE, and configure the phase shifter 240 to use this target phase calibration amount selected from the plurality of candidate phase calibration amounts Δϕ1-Δϕn.

Figure 3:
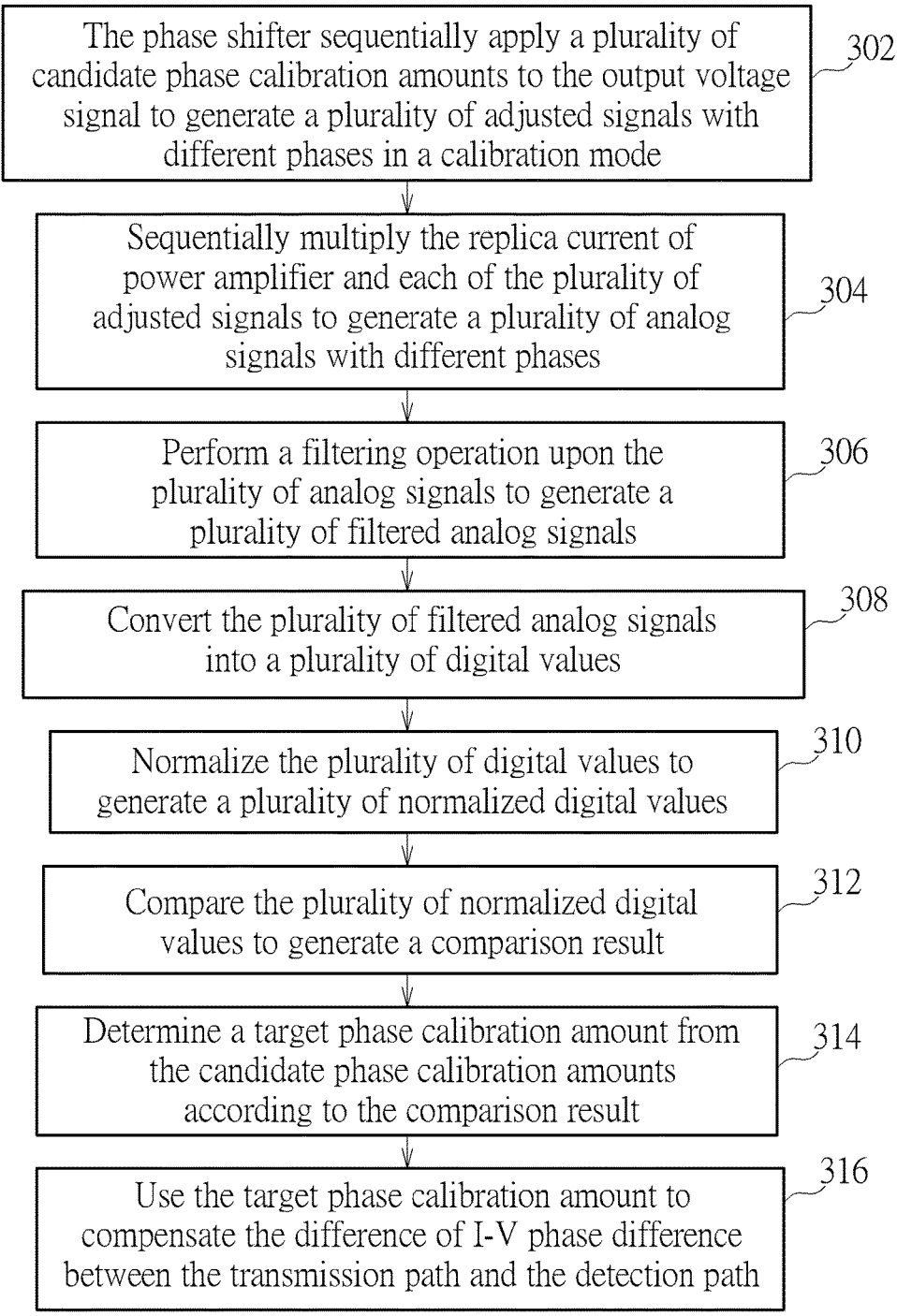
FIG. 3 is a flowchart illustrating a method for detecting an output power of a power amplifier according to an embodiment of the present invention.

Please refer to FIG. 3, which is a flowchart illustrating a method for detecting an output power of a power amplifier according to an embodiment of the present invention. Provided that the result is substantially the same, the steps are not required to be executed in the exact order shown in FIG. 3. For example, step 310 can be performed before step 308. The exemplary method may be employed by the power detector 200 shown in FIG. 2, and can be briefly summarized using the following steps.

Step 302: The phase shifter sequentially apply a plurality of candidate phase calibration amounts to the output voltage signal to generate a plurality of adjusted signals with different phases in a calibration mode.

Step 304: Sequentially multiply the replica current of power amplifier and each of the plurality of adjusted signals to generate a plurality of analog signals with different phases.

Step 306: Perform a filtering operation upon the plurality of analog signals to generate a plurality of filtered analog signals.

Step 308: Convert the plurality of filtered analog signals into a plurality of digital values.

Step 310: Normalize the plurality of digital values to generate a plurality of normalized digital values.

Step 312: Compare the plurality of normalized digital values to generate a comparison result.

Step 314: Determine a target phase calibration amount from the candidate phase calibration amounts according to the comparison result.

Step 316: Use the target phase calibration amount to compensate the difference of I-V phase difference between the transmission path and the detection path.

As a person skilled in the art can readily understand details of each step shown in FIG. 3 after reading the above paragraphs directed to the power detector 200 shown in FIG. 2, further description is omitted here for brevity.

To summarize, the present invention provides a power detector capable of compensating the difference of I/V phase differences between the transmission path and the detection path, so that the difference of I/V phase differences (e.g. the phase delay ϕ) between the transmission path and the detection path can be compensated to improve the TSSI accuracy.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A power detector for detecting an output power of a power amplifier, the power detector comprising:
   a phase shifter, coupled to the output end of the power amplifier, and sequentially apply a plurality of candidate phase calibration amounts to the output voltage of the power amplifier to generate a plurality of adjusted signals with different phases in a calibration mode;
   a multiplier, coupled to the phase shifter and the power amplifier replica, the multiplier arranged to sequentially multiply the replica current of power amplifier and each of the plurality of adjusted signals, to generate a plurality of analog signals with different phases; and
   a calibration circuit, coupled to the multiplier, the calibration circuit arranged to determine a target phase calibration amount of the phase shifter from the candidate phase calibration amounts according to the plurality of analog signals;
   wherein the power amplifier has an input end and an output end, the input end of the power amplifier is used to receive an input signal, and the power amplifier generates an amplified signal with the output power at the output end according to the input signal.

2. The power detector of claim 1, wherein the calibration circuit comprises:
   a filter, arranged to perform a filtering operation upon the plurality of analog signals received from the multiplier to generate a plurality of filtered analog signals;
   an analog-to-digital (A/D) convertor, arranged to convert the plurality of filtered analog signals received from the filter into a plurality of digital values;
   a comparison unit, arranged to compare the plurality of digital values to generate a comparison result; and
   a control unit, arranged to refer to the comparison result to configure the phase shifter to use the target phase calibration amount.

3. The power detector of claim 2, wherein when the comparison result indicates that a specific digital value generated due to a specific phase calibration amount is a maximum value among the plurality of digital values, the control unit configures the phase shifter to use the specific phase calibration amount as the target phase calibration amount.

4. The power detector of claim 3, wherein the power amplifier is part of a transmitter, and both the filter and the A/D converter are part of a receiver.

5. The power detector of claim 1, wherein the calibration circuit comprises:
   a filter, arranged to perform a filtering operation upon the plurality of analog signals received from the multiplier to generate a plurality of filtered analog signals;
   an analog-to-digital (A/D) convertor, arranged to convert the plurality of filtered analog signals received from the filter into a plurality of digital values;
   a normalizing unit, arranged to normalize the plurality of digital values received from the A/D convertor to generate a plurality of normalized digital values;
   a comparison unit, arranged to compare the plurality of normalized digital values to generate a comparison result; and
   a control unit, arranged to refer to the comparison result to configure the phase shifter to use the target phase calibration amount.

6. The power detector of claim 5, wherein when the comparison result indicates that a specific normalized digital value generated due to a specific phase calibration amount is a maximum value among the plurality of normalized digital values, the control unit configures the phase shifter to use the specific phase calibration amount as the target phase calibration amount.

7. The power detector of claim 5, wherein the power amplifier is part of a transmitter, and both the filter and the A/D converter are part of a receiver.

8. The power detector of claim 1, further comprising:
a register, arranged to store a control value corresponding to the target phase calibration amount;
wherein the phase shifter is controlled by the control value to provide the target phase calibration amount in a normal mode.

9. A method for detecting an output power of a power amplifier, comprising:
applying a plurality of candidate phase calibration amounts, by a phase shifter coupled to the output end of the power amplifier, to the output voltage of the power amplifier to generate a plurality of adjusted signals with different phases in a calibration mode;
sequentially multiplying, by a multiplier coupled to the phase shifter and the power amplifier replica, the replica current and each of the plurality of adjusted signals, to generate a plurality of analog signals with different phases; and
determining, by a calibration circuit coupled to the multiplier, a target phase calibration amount from the candidate phase calibration amounts according to the plurality of analog signals;
wherein the power amplifier has an input end and an output end, the input end of the power amplifier is used to receive an input signal, and the power amplifier generates an amplified signal with the output power at the output end according to the input signal.

10. The method of claim 9, further comprising:
performing a filtering operation upon the plurality of analog signals to generate a plurality of filtered analog signals;
converting the plurality of filtered analog signals into a plurality of digital values;
comparing the plurality of digital values to generate a comparison result; and
referring to the comparison result to use the target phase calibration amount.

11. The method of claim 10, further comprising:
when the comparison result indicates that a specific digital value generated due to a specific phase calibration amount is a maximum value among the plurality of digital values, using the specific phase calibration amount as the target phase calibration amount.

12. The method of claim 9, further comprising:
performing a filtering operation upon the plurality of analog signals to generate a plurality of filtered analog signals;
converting the plurality of filtered analog signals into a plurality of digital values;
normalizing the plurality of digital values to generate a plurality of normalized digital values;
comparing the plurality of normalized digital values to generate a comparison result; and
referring to the comparison result to use the target phase calibration amount.

13. The method of claim 12, further comprising:
when the comparison result indicates that a specific normalized digital value generated due to a specific phase calibration amount is a maximum value among the plurality of normalized digital values, using the specific phase calibration amount as the target phase calibration amount.

14. The method of claim 9, further comprising:
storing a control value corresponding to the target phase calibration amount; and
using the control value to provide the target phase calibration amount in a normal mode.

* * * * *